United States Patent

Koike et al.

[11] Patent Number: 4,689,687
[45] Date of Patent: Aug. 25, 1987

[54] CHARGE TRANSFER TYPE SOLID-STATE IMAGING DEVICE

[75] Inventors: Norio Koike, Suginami; Masaaki Nakai, Tokorozawa; Haruhisa Ando, Nishitama; Toshifumi Ozaki, Koganei; Shinya Ohba, Tsukui; Hideyuki Ono, Kokubunji; Toshiyuki Akiyama, Kodaira, all of Japan

[73] Assignee: Hitachi, Ltd., Tokyo, Japan

[21] Appl. No.: 796,752

[22] Filed: Nov. 12, 1985

[30] Foreign Application Priority Data

Nov. 13, 1984 [JP] Japan .................. 59-239245
Dec. 19, 1984 [JP] Japan .................. 59-266104
Mar. 6, 1985 [JP] Japan .................. 60-42639

[51] Int. Cl.⁴ .................................. H04N 3/14
[52] U.S. Cl. ...................... 358/213.24; 358/213.29
[58] Field of Search ................ 358/213, 212; 357/24 LR

[56] References Cited

U.S. PATENT DOCUMENTS 4,046,533 12/1977 Lampe et al. .................. 358/213
4,514,766 4/1985 Koike et al. .................. 358/213

Primary Examiner—Gene Z. Rubinson
Assistant Examiner—Stephen Brinich
Attorney, Agent, or Firm—Antonelli, Terry & Wands

[57] ABSTRACT

A charge transfer type solid-state device incorporating a charge coupled device (CCD). In order to eliminate field after image and smear, at least two electrode pairs are provided in a vertical CCD shift register for transferring the signal charges stored in photoelectric conversion elements, the electrode pairs being disposed within the vertical pitch of the photoelectric conversion elements.

15 Claims, 23 Drawing Figures

CHARGE TRANSFER TYPE SOLID-STATE IMAGING DEVICEP

BACKGROUND OF THE INVENTION

1. Field of the Invention

The present invention relates to a solid-state imaging device which makes use of a charge coupled device (referred to as "CCD", hereinunder) for taking out optical information from a photoelectric conversion element.

2. Description of the Prior Art

Solid-state imaging devices are required to have high resolution equivalent to that of imaging electron tubes used in TV broadcasting. The device, therefore, has a matrix constituted by picture elements arranged in 500 vertical rows and 800 to 1000 horizontal lines arranged on a semiconductor substrate, as well as scanning elements corresponding to the picture elements. Therefore, solid-state imaging devices are produced by making use of MOS large-scale circuit technique capable of forming a high degree of integration. Usually, CCDs or MOS transistors are used as the constituent elements of the solid-state imaging device.

CCD solid-state imaging devices have been developed which employ low-noise CCDs as the charge transfer elements for taking out the signal charges accumulated in photoelectric conversion elements.

FIG. 1 shows the basic arrangement of a CCD solid-state imaging device, which was described in "Study on Overflow CCD Image Sensor" by Oda et al in the transaction of 1981 Conference of All Japan Society of Television Engineers. In this Figure, a reference numeral 1 denotes a photoelectric conversion element constituted by a photodiode, while 2 and 3 denote vertical CCD register (referred to as "vertical CCD", hereinunder) and horizontal CCD register (referred to as "horizontal CCD", hereinunder) for picking up the optical signals accumulated in the photoelectric conversion element group and delivering the same to the output terminal 4 of the signal detecting circuit. Numerals 5-1, 5-2, 6-1 and 6-2 denote generators for generating clock pulses for driving the vertical CCD 2 and the horizontal CCD 3. Although two-phase type clock pulse generators are shown, the invention does not exclude the use of four- or three-phase forms of clocks. Numerals 7-1 and 7-2 designate a transfer gates through which the electric charges stored in the photodiode 1 are delivered to the vertical CCD. The solid imaging device shown in FIG. 1 as it is can be used as a monotone imaging device, and is usable also as a color imaging device having color information in combination with color filters laminated thereon.

FIG. 2 shows sectional views of the CCD solid-state imaging device shown in FIG. 1, taken along the lines x—x' and y—y'. In this Figure, a photodiode of, for example, n-type, 2' denotes a diffusion layer for the burried channel constituting the vertical CCD 2. The diffusion layer 2' is of, for example, the n-type, and is unnecessary in the case of a surface channel. Numerals 2-a and 2-b denote a pair of electrodes constituting the vertical CCD 2, formed by, for example, polycrystalline silicon of the first and second layers, respectively. A numeral 7 designates a transfer gate portion, 8 designates a gate oxide film, e.g., $SiO_2$, 9 denotes a picture element isolation oxide film ($SiO_2$), e.g., $SiO_2$, 10 denotes an isolation oxide film, 11 denotes a light shielding film for preventing any leak of light to the area outside the photodiode region, e.g., a metallic film such as of Al, and 12 denotes a semiconductor substrate of, for example, the p-type. A layer 13 formed on the underside of the electrode 2-a is an impurity layer of, for example, the p-type provided for the purpose of generation of a potential difference between the electrode 2-a and the electrode 2-b. The charges are transferred in the direction of an arrow 14, by virtue of the internal voltage barrier constituted by the impurity layer 13. The films 10 and 11 are omitted from FIG. 2(b).

The solid-state imaging device has various advantages such as reduced size and weight, reduced power consumption, as well as being maintenance-free as compared with the electron tube, owing to its solid-state nature, and it has a promising future as an imaging device. Unfortunately, however, the CCD imaging devices at the present level of technology encounter the following problems which make it difficult to improve the quality of the picture.

Scanning the vertical or row direction is conducted in an interlace manner so that picture element signals of odd-number lines (1, 3, 5, ..., 2N-1) and picture element signals of even-number lines (2, 4, 6, ..., 2N) are obtained in the first and the second fields, respectively. Consequently, in the first field of the succeeding frame, the signals of the line which was not read in the immediately preceding field, i.e., the signals of an odd-number line, are read in addition to the new signals. This phenomenon is usually referred to as "after image". The solid-state imaging device is advantageous in that it does not cause any after image by virtue of a high switching speed. Actually, however, a field after image is inevitably generated due to the interlace reading system mentioned above. Also, in a monitor having a high intensity of incidence light, white fringes are formed on the upper and lower sides of an objective image of large incidence light intensity. This phenomenon is usually referred to as "smear". Smear seriously impairs the quality of the picture as is the case of the after image.

Accordingly, it is very important to overcome these problems, in the future use of solid-state imaging devices.

SUMMARY OF THE INVENTION

Accordingly, a first object of the invention is to provide a charge transfer type solid-state imaging device which can produce an image which suffers from no field after image.

A second object of the invention is to provide a charge transfer type solid-state imaging device which is capable of eliminating noise such as smear.

To this end, according to the invention, there is provided a charge transfer type solid-state imaging device comprising: photoelectric conversion elements arranged in plural both in lines and rows on the surface of a semiconductor substrate, the photoelectric conversion elements being adapted to store a signal which is charged corresponding to the quantities of incidence light; first charge transfer means arranged for respective rows of the photoelectric conversion elements and adapted for successively picking up and transferring signal charge stored in the photoelectric conversion elements, each of the first charge transfer means having a plurality of electrode pairs which form regions of different potentials in the semiconductor substrate; means for supplying pulse signals in a predetermined sequence to the electrodes of the first charge transfer means, thereby causing the signal charges to be transferred; and a second charge transfer means adapted to receive in a parallel manner the plurality of rows of signal charges transferred by the first charge transfer means and to transfer the thus received signal charged in sequence to the output terminal; wherein each of the first charge transfer means includes at least two pairs of electrodes arranged within the pitch of the photoelectric conversion elements in the row direction.

According to the invention, since the signal charges of the odd-number and even-number lines of a photoelectric conversion element can be transferred simultaneously, it is possible to obtain an image picture suffering from no field after image. In addition, since the smear charge can be transferred besides the signal charges, it is possible to obtain an image having no smear.

These objects together with others not specifically mentioned will become clear to those skilled in the art from the following description.

DETAILED DESCRIPTION OF THE PREFERRED EMBODIMENTS

The preferred embodiments of the invention will be described hereinunder with reference to the accompanying drawings.

Figure 3:
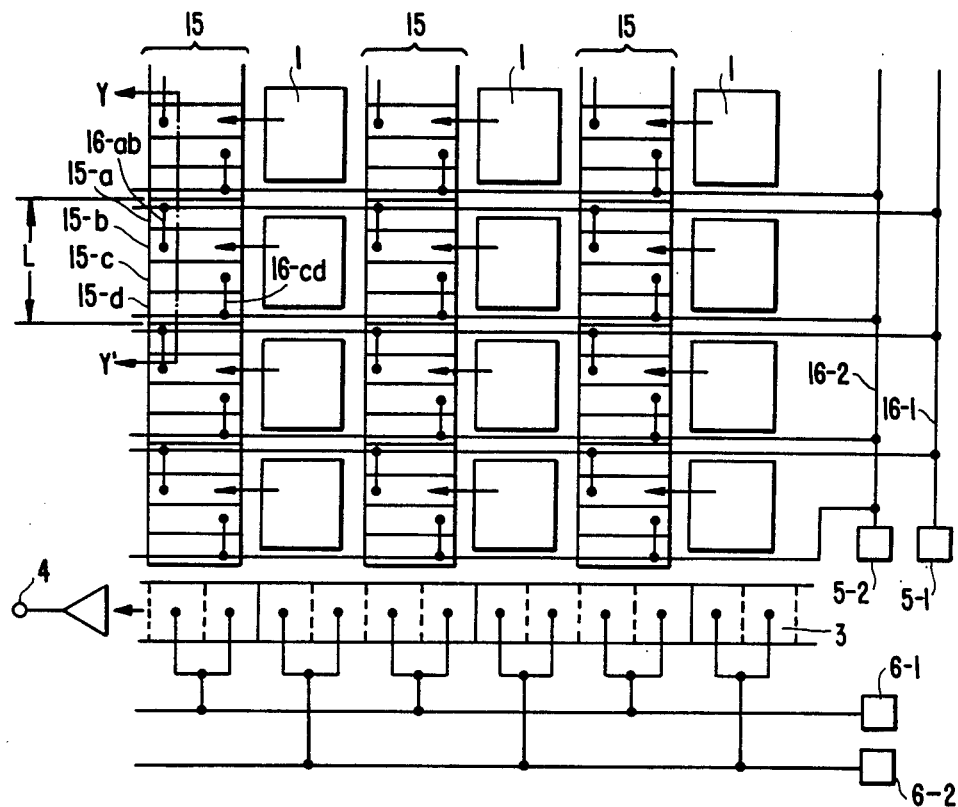
FIG. 3 is an illustration of an embodiment of the invention.

FIG. 3 shows the construction of a first embodiment of the charge transfer type solid-state imaging device in accordance with the invention.

Figure 1:
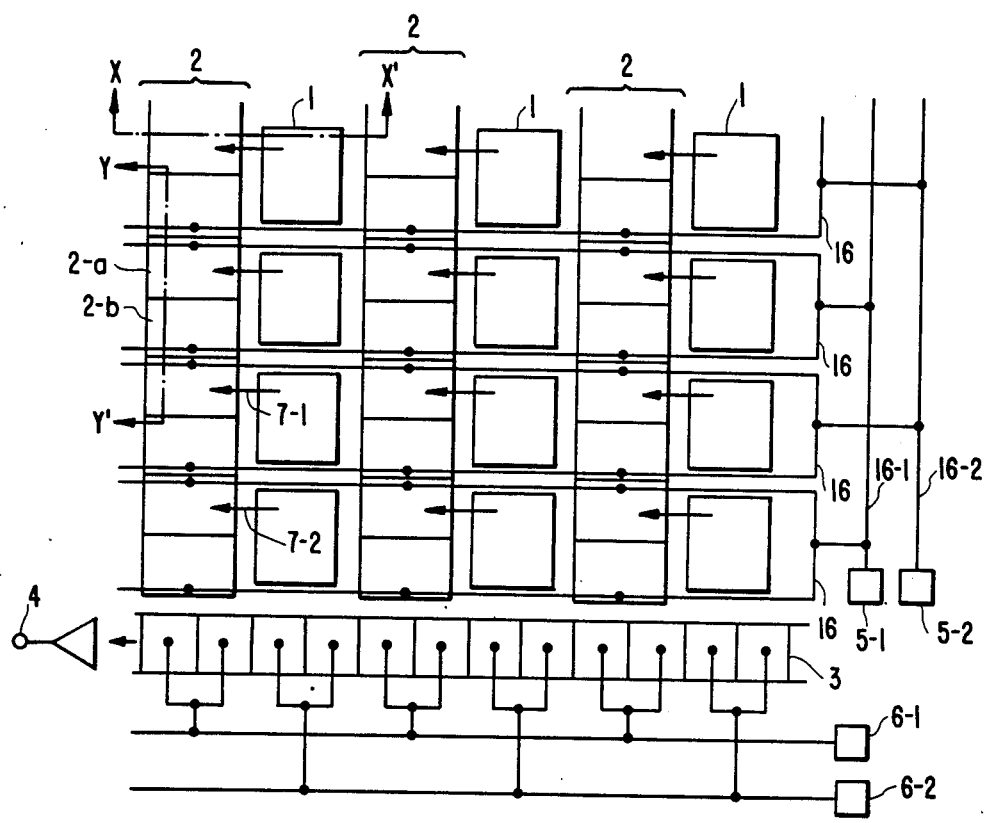
FIG. 1 is an illustration of a conventional solid-state imaging device.

This device has a photoelectric conversion element 1, horizontal CCD shift register 3, output terminal 4 and clock pulse generators 5-1, 5-2, 6-1 and 6-2 all of which are identical to those shown in FIG. 1. This device, however, employs a vertical CCD 15 (see FIG. 3) different from that used conventionally. The difference is evident in FIG. 4 which shows the sectional view of the vertical CCD 15 taken along the line y—y'.

Figure 2A:
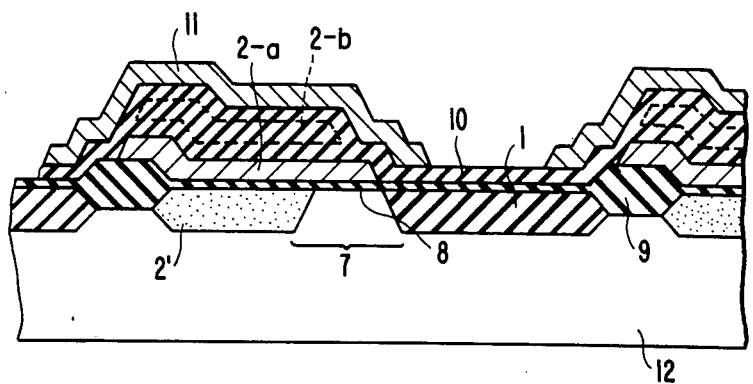
FIG. 2 is a fragmentary sectional view of a solid-state imaging device shown in FIG. 1.
Figure 2B:
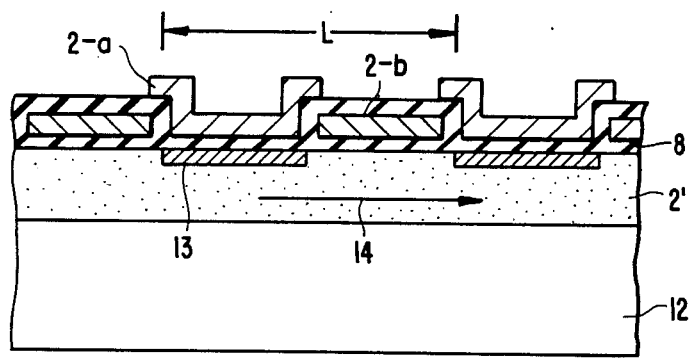
Figure 4:
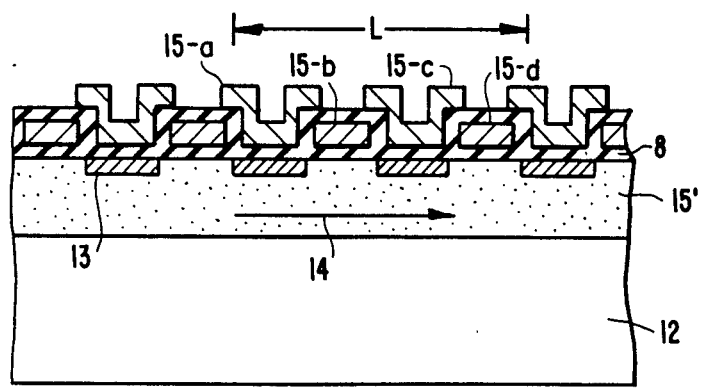
FIG. 4 is a fragmentary sectional view of a vertical CCD of the solid-state imaging device shown in FIG. 3.

Namely, while the conventional CCD employs only one pair of electrodes 2-a, 2-b within the vertical pitch L of the photoconductive conversion element as shown in FIG. 2(b), the vertical CCD 15 is shown in FIG. 4 employs two pairs of electrodes (15-a, 15-b; 15-c, 15-d) within the vertical pitch L. That is, the number of the electrodes in the vertical CCD register used in the device of the invention is double the number of electrodes in the CCD shift register used in the known device. According to this arrangement, the vertical CCD shift register 15 is enabled to transfer the signals from a plurality of lines thereby avoiding the field after image and also to transfer false signals of the kind which smear photodiode signals.

As has been described, in the solid-state imaging device of the invention shown in FIG. 3, the number of the electrode pairs (15-a, 15-b; 15-c, 15-d) is double the number of the electrode pair in the conventional vertical CCD shift register shown in FIG. 1. Therefore, the size L of the electrode pair (2-a, 2-b) is reduced to a half L/2 of the electrode pair (15-a, 15-b), so that the number of electrodes in the vertical CCD shift register 15 shown in FIG. 3 is double that in the conventional vertical CCD shift register.

The doubled arrangement of the electrodes in turn requires corresponding wiring arrangement (denoted by 16 in FIG. 1) for delivering clock voltages to the newly arranged electrodes. This wiring inevitably comes across a part of the photodiode region arranged at a pitch of L. Namely, since the pitch of the photodiodes is still L while the pitch of the wiring is reduced to L/2, the wiring divides the photodiodes into two parts and runs across the centers of the photodiodes in the arrangement shown in FIG. 3.

Consequently, the area of photodiode, i.e., the charge accumulating capacity, and the area of incidence light, i.e., the opening ratio, is largely decreased such as to cause a reduction in the dynamic range, i.e., the allowable light-indensity range, of the imaging device and also in the reduction of photosensitivity.

In the embodiment shown in FIG. 3, therefore, the CCD shift register is composed of electrodes 15-a, 15-b with wiring (referred to as combined electrode) and electrodes 15-b, 15-c 15-b, 15-c without wiring (referred to as sole electrodes), and preselected sole electrodes 15-b, 15-c are electrically connected to the corresponding combined electrodes 15-a, 15-d.

This arrangement will be described in more detail hereinunder.

The vertical CCD 15 is composed of combined electrodes 15-a, 15-d with wiring and sole electrodes 15-b, 15-c without wiring. The sole electrode 15-b is connected to the combined electrode 15-a through a conductor 16-ab, while the sole electrode 15-c is connected to the combined electrode 15-d through the conductor 15-a. Therefore, clock pulses $\phi_1$ generated by the clock pulse generator 5-1 are delivered to the electrode pairs 15-a, 15-b, while the clock pulses $\phi_2$ generated by the clock pulse generator 5-2 are delivered to the electrode pair 15-c, 15-d.

Figure 5:
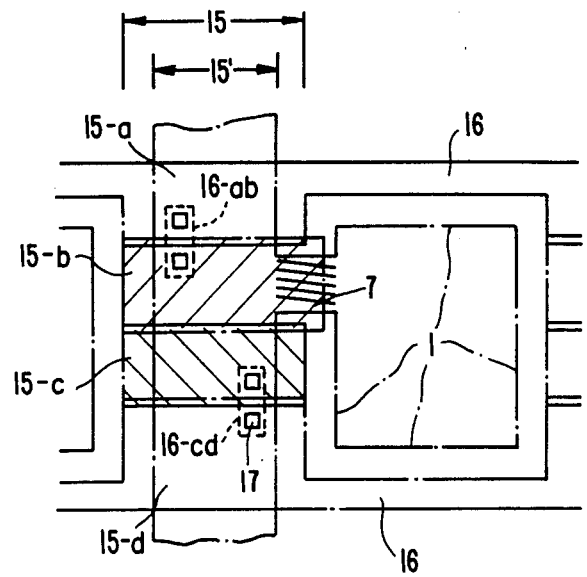
FIG. 5 is an illustration of the planar lay-out of the picture elements in the solid-state imaging device shown in FIG. 3.

FIG. 5 shows an example of the planar lay-out of the picture elements. In this Figure, a numeral 1 denotes a diode region, hatched area 7 denotes a transfer gate region, 15' denotes a buried channel diffusion layer region, 16-ab denotes the conductor for electrically connecting the electrodes 15-a and 15-b to each other, and 16-cd represents the conductor for connecting the electrodes 15-c and 15-d to each other. A numeral 16 denotes a wiring region serving also as the electrodes 15-*a* or 15-*d*. A numeral 17 designates a contact hole region for providing so-called ohmic contact between the conductors 16-*ab*, 16-*cd* and the electrodes 15-*a*, 15-*b*, 15-*c* and 15-*d*.

Figure 6:
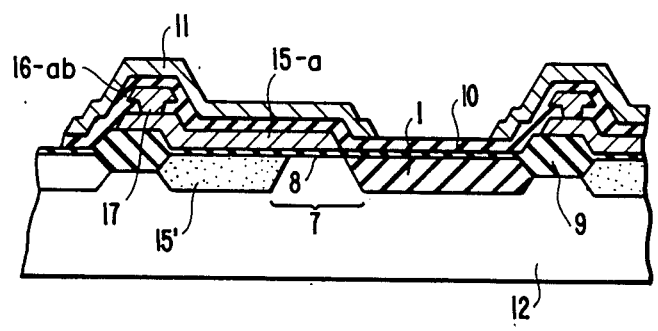
FIG. 6 is a sectional view of a picture element in the solid-state imaging device shown in FIG. 3.
Figure 7:
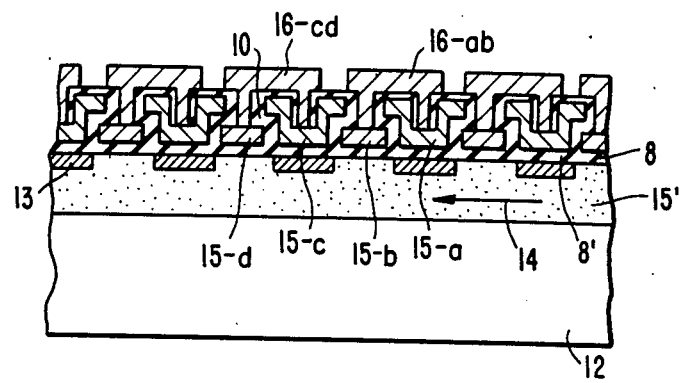
FIGS. 7 and 8 are fragmentary sectional views of different examples of the vertical CCD used in the first embodiment shown in FIG. 3.
Figure 8:
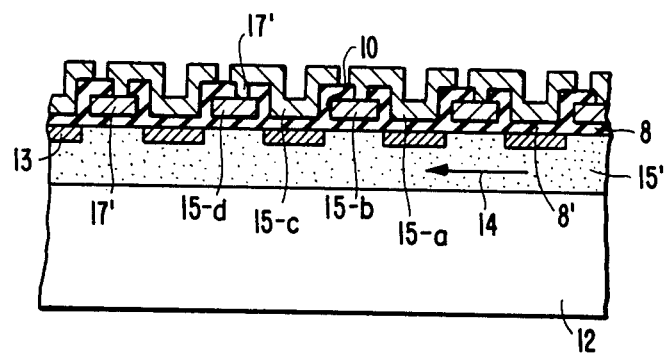

FIG. 6 shows the section of the picture element. The conductor 16-*ab* is held in ohmic contact with the electrode 15-*a*, e.g., by Al, while the contact hole region 17 has the form of a contact hole formed in the isolation oxide film 10. FIG. 7 is a sectional view of the vertical CCD shift register 15 taken in the direction of transfer, i.e., towards the horizontal CCD shift register. From this Figure, it will be seen how the electrodes 15-*a* and 15-*b* are connected to each other through the conductor 16-*ab* and how the electrodes 15-*d* and 15-*c* are connected to each other through the conductor 16-*ab*. In the embodiment shown in FIG. 3, specific conductors 16-*ab* and 16-*cd* are used for the electric connections between the electrodes. This, however, is not exclusive and the arrangement may be such that a contact hole 17' is formed in the oxide film on the electrodes 15-*b*, 15-*d* of the first layer and the electrodes 15-*a*, 15-*c* of the second layers are formed on the first layer, as shown in FIG. 8. In this case, it is not necessary to employ the conductors because the electrodes 15-*b*, 15-*d* on the first layer directly contact the electrodes 15-*a*, 15-*c* on the second layer. It is thus possible to double the number of electrodes on the vertical CCD as compared with the conventional element.

An explanation will be given hereinunder as to the method of producing this element. This element is produced by a process having the following steps:

(1) A buried channel diffusion layer 15' of, for example, the n-type is formed on the major surface of a semiconductor substrate 12 of, for example, the p-type. This step can be neglected in the case of a surface channel type element.

(2) A gate oxide film 8 is formed on the substrate surface.

(3) Electrodes 15-*b* and 15-*d* are formed by polycrystalline silicones of, for example, the first layer and then a gate oxide film 8' for the gate electrodes 15-*a*, 15-*c* are formed. This oxide film 8' serves also as an oxide film 10 for isolating the electrodes 15-*b*, 15-*d* from electrodes 15-*a*, 15-*c* which are formed in the next step.

(4) The above-mentioned electrodes 15-*a*, 15-*c* are formed by, for example, polycrystalline silicones of the second layer. Subsequently, an oxide film is formed for isolating the electrodes 15-*a*, 15-*c* from wiring which is formed later.

(5) A certain region of the oxide film covering the electrodes 15-*b*, 15-*d*, 15-*a*, 15-*c* is selectively removed by etching and a conductor is formed by vapor deposition on this region where the oxide film has been removed, such as to connect, for example, the electrodes 15-*a* and 15-*b* to the electrodes 15-*c* and 15-*d*, respectively. It is possible to use, as the connecting conductor, the Al or Mo used in the wiring in other regions. By such a method, the connecting conductors can be formed simultaneously with the formation of such wiring, so that the element in accordance with the invention can be formed by the same technique as the technique for producing known elements.

Figure 9:
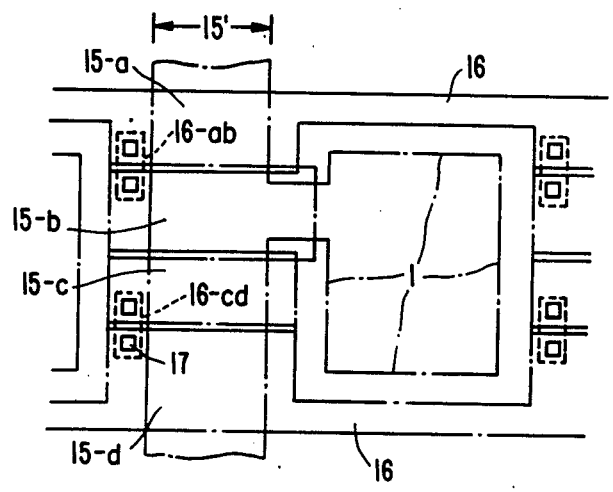
FIG. 9 is an illustration of a different example of the planar lay-out of picture elements shown in FIG. 5.

FIG. 9 shows another example of the CCD imaging device of the invention. In this case, the connecting conductors 16-*ab*, 16-*cd* are formed outside the buried channel region 15' on the same side of the latter, in contrast to the embodiment shown in FIG. 5 in which the connecting conductors are formed on the buried channel region 15' at the left and right sides of the latter. According to this arrangement, the risk of damaging of the electrode corresponding to the upper part of the channel region for charge transfer is avoided during etching for forming the contact hole. The connecting conductors 16-*ab* and 16-*cd* may be provided outside the buried channel region on opposite sides of that region.

In the embodiment shown in FIG. 3, since metal wires (usually wires of Al) are used as the peripheral clock wiring 16-1, 16-2, the clock pulses supplied by the pulse generator 5 are transmitted almost in real rise and fall time, usually on the order of several tens of n sec. In contrast, the wiring in the picture element region is formed of the same conductor as the vertical CCD shift register which is usually made of polycrystalline silicon, such that the conductors serve both as the electrodes and wiring, as is the case of the wiring 16 in FIG. 9. Therefore, the wiring resistance in this case is as high as 100 k-ohms so that the rise and fall time is about $10^2$ times as large as that in the case mentioned above, and may well reach 3 $\mu$sec., at the terminal end of the wiring. In consequence, the transfer speed is largely limited and the transfer loss, i.e., the charges which remain under the electrode without being transferred in a given time, is also increased.

In order to attain a higher resolution or to enable processing of a plurality of signals as in the case where signals of two or three lines are read simultaneously, the operation speed must be as high as double or triple the present speed. Thus, CCD type imaging devices are required to operate at higher speeds, and such a demand will increase in the future use of this type of device.

Figure 10:
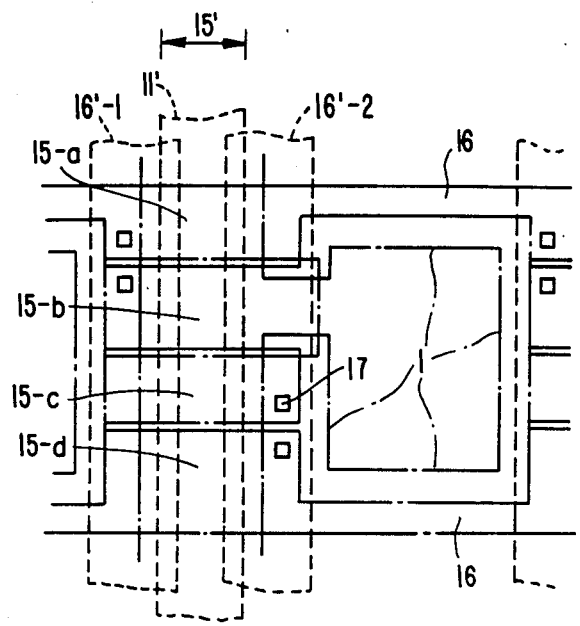
FIG. 10 is an illustration of planar lay-out of picture elements of another embodiment of the solid-state imaging device.

FIG. 10 shows another embodiment of the CCD type imaging device. In this embodiment, the conductors for connecting the electrodes are extended in the vertical direction as denoted by 16'-1, 16'-2, in contrast to the embodiment shown in FIG. 3 in which the conductors have limited lengths. In this embodiment, the connecting conductors 16'-1 and 16'-2 function also as light-shield for the vertical CCD. The region devoid of the conductors can be shielded by the conductor 11' of the second layer, e.g., by Al, as in the conventional device. In this case, the end of the light shield can be determined by the conductor of the first layer which can be formed precisely, so that the photo-effect and photo-sensitivity can be improved advantageously over the conventional device in which the light shield is performed by the conductor of the second layer.

Figure 11:
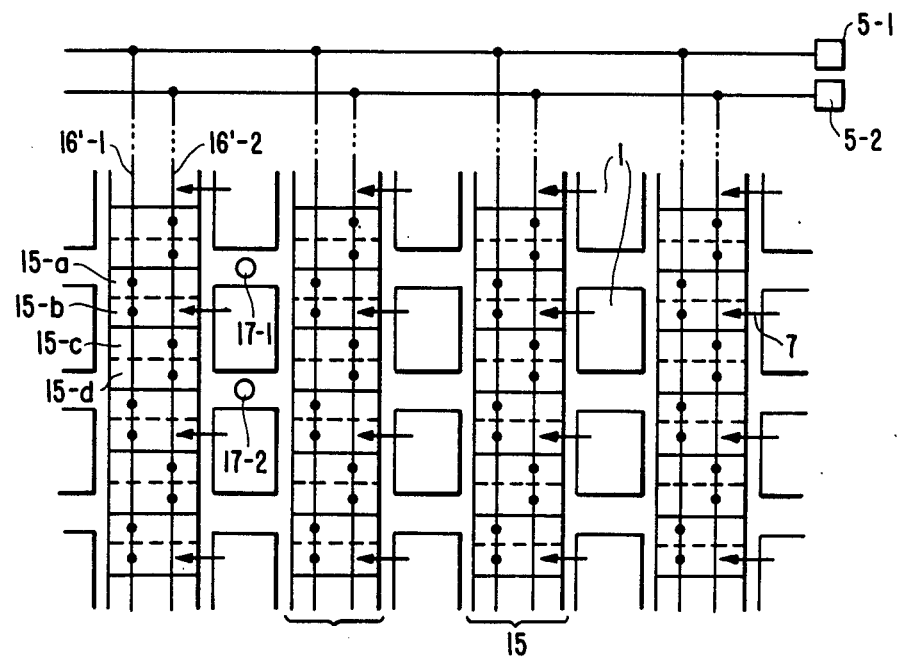
FIGS. 11, 12, 13, 14 and 15 are illustrations of different embodiments.

FIG. 11 shows a general arrangement of a CCD type element constituted by the picture elements shown in FIG. 10. The horizontal CCD shift register, however, is omitted from this Figure. In this embodiment, the conductors 16'-1, 16'-2 for connecting the electrodes extend in the vertical directions, and the conductors are connected to respective clock pulse generators 5-1, 5-2 at the upper regions of the picture elements. In consequence, the regions occupied by the horizontal wiring 17-1, 17-2 constituted by the electrodes 15-*a*, 15-*b* can be eliminated and the opening ratio can be increased by virture of the elimination of these regions, thus increasing photo-sensitivity correspondingly. This embodiment does not exclude the presence of wirings 17-1, 17-2 as in the case of the embodiment shown in FIG. 3. In this case, however, the opening ratio is limited to the small value which is the same as that in the embodiment shown in FIG. 3. The wiring in this embodiment is preferably made by Al or some other metal, so that the rise and fall time of the clock pulses can be increased by $10^2$, increase in the transfer speed, as compared with the case where the wiring is made with a semiconductor material forming the electrodes, e.g., polycrystalline silicon.

Figure 12:
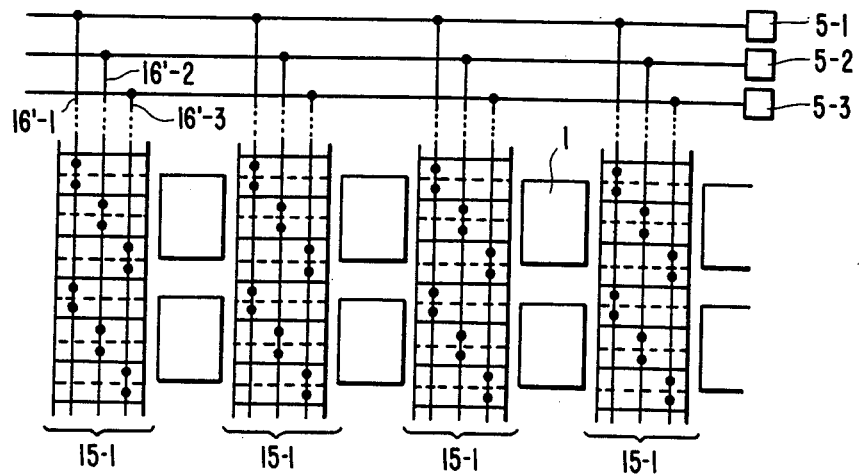

In the embodiment explained hereinunder, the invention is applied to an interline type of CCD element which is a typical CCD element. The invention, however, is not limited to this configuration, and can equally be applied to other types of elements such as CCD devices of the frame transfer type, CCD devices of the frame-interline transfer type or to one-dimensional CCD type devices. Moreover, the clock pulses which driving the vertical CCD shift register may be of any desired number of phases, e.g., three or four phase pulses, although two-phase clock pulses are used exemplarily in the described embodiment for the purpose of simplification of explanation. In the described embodiment, the vertical CCD shift register has two pairs of electrodes. The invention, is not however, limited to this configuration, and the CCD register can have three pairs of electrodes by employing three conductors 16'-1, 16'-2 and 16'-3 on the vertical shift register as shown in FIG. 12. The number of pairs of electrodes may be further increased to 4, 5 or up to N, by increasing the number of the conductors correspondingly.

Figure 15:
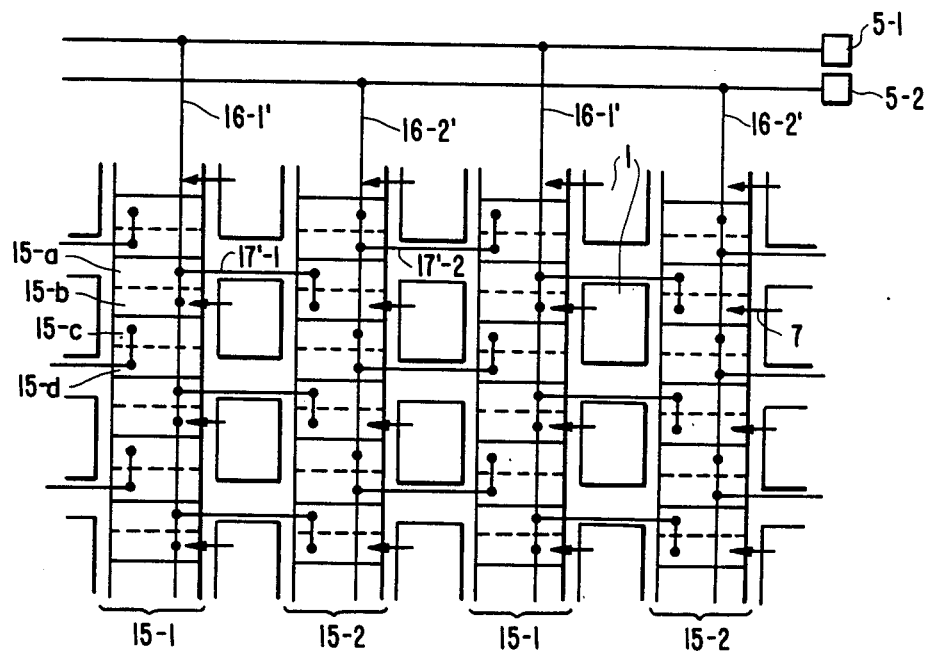
Figure 13:
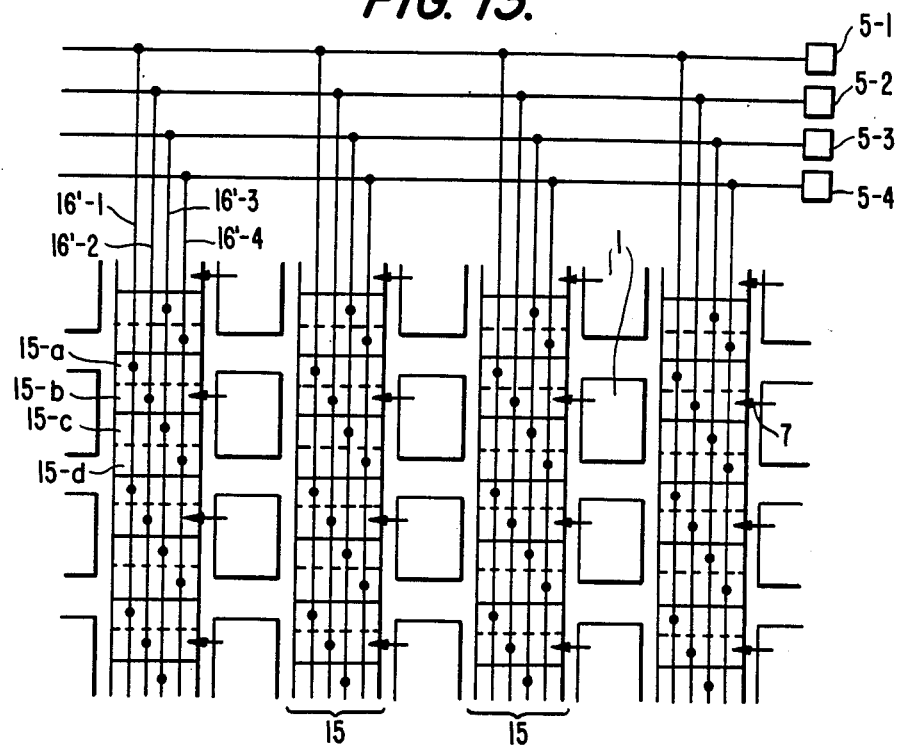
Figure 14:
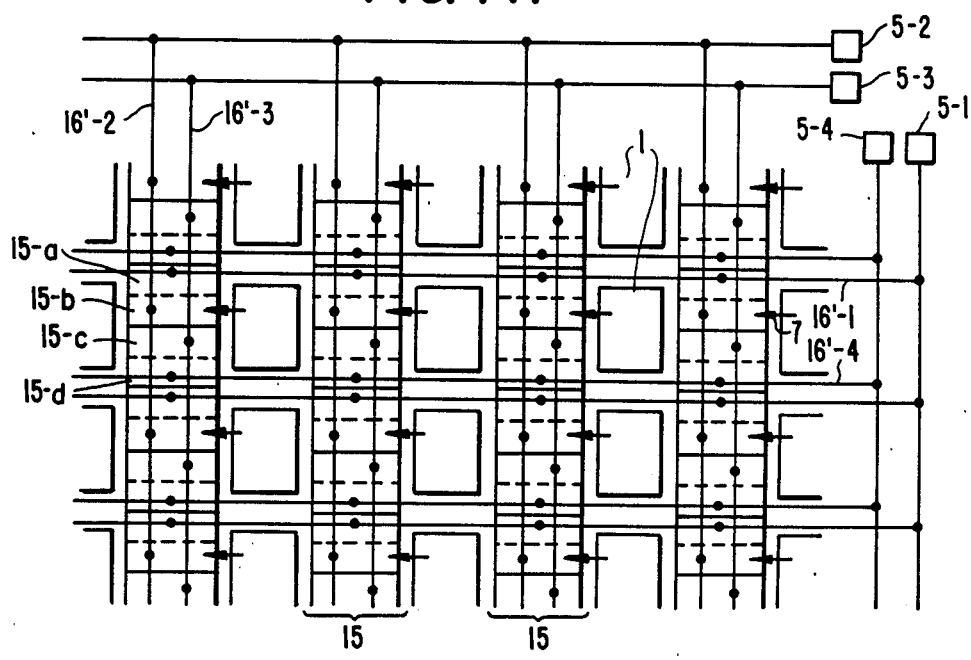

The arrangement may be such that the conductors 16'-1, 16'-2, 16'-3 and 16'-4 are laid on respective electrodes 15-a, 15-b, 15-c and 15-d, as shown in FIG. 13. In this case, four conductors are laid on the vertical CCD 15, so that it becomes necessary to increase the breadth of the vertical CCD 15. This problem, however, can be overcome by laying the conductors 16'-1, 16'-3 on the vertical CCD 15, while the conductors 16'-1, 16'-4 are laid horizontally between adjacent photodiodes 1 as shown in FIG. 14. Another countermeasure is that, as shown in FIG. 15, the pair of electrodes 15-a, 15-b of the vertical CCD 15-1 are connected to the conductor 16-1', while the pair of electrodes 15-a and 15-b of the vertical CCD 15-2 are connected through a conductor and, then, the pair of electrodes 15-c and 15-d of the vertical CCD 15-2 are connected through the conductor 16-2' while the pair of electrodes 15-c and 15-d are connected to each other through the conductor 17'-2.

As will be understood from the foregoing description of the embodiment, according to the invention, the vertical CCD shift register is constructed by combined electrodes and sole electrodes, so that the number of electrodes on the vertical shift register can be increased without incurring a reduction in the dynamic range and photo-sensitivity. It is to be noted also that the solid-state imaging device of the invention can be produced by a planar design. That is, the structural design may be the same as that for a conventional device. With this invention, therefore, the construction is not complicated despite the increased number of electrodes and the production may be made by the same production technique as the conventional technique, without being accompanied by problems such as a reduction in the production yield.

A description will be made as to the method of driving the solid-state imaging device of the invention.

Figure 16:
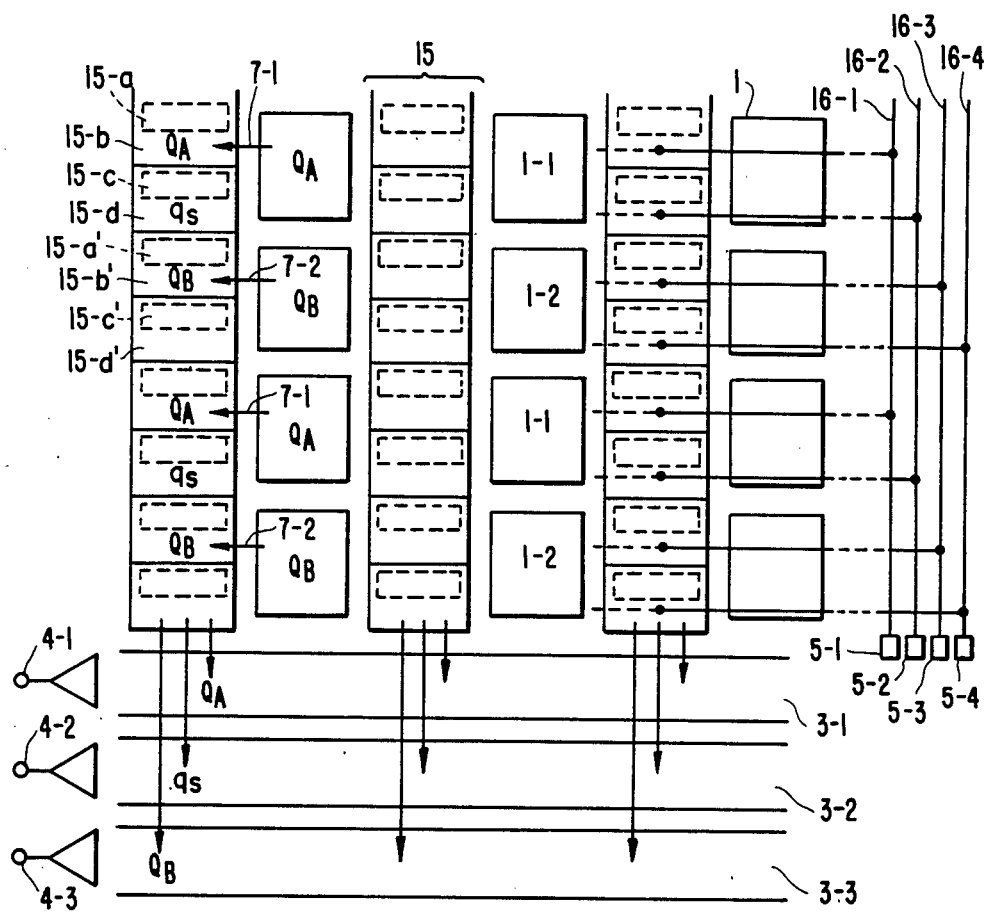
FIGS. 16, 17, 20, 21 and 22 are illustrations of triple transfer of vertical CCD.

Referring to FIG. 16, numerals 1-1 and 1-2 denote photodiodes, 15 denotes a vertical CCD having an ion injection region 13 shown in FIG. 4 and adapted to perform a triple transfer operation, 15-a, 15-b, . . . , 15-d . . . are electrodes which constitute the CCD 15, 3-1, 3-2, 3-3 denote horizontal CCDs which are adapted to receive three types of charges $Q_A, Q_B, Q_S$ from the vertical CCD 15 and to transfer the same to respective output terminals 4-1, 4-2, 4-3, and 5-1, 5-2, 5-3 and 5-4 denote a vertical clock pulse generator for driving the vertical CCD 15. The horizontal clock pulses for driving the horizontal CCD 3-1, 3-2, 3-3 are omitted for the simplification of the drawings. The horizontal clock pulses may be of any desired number of phases, e.g., two, three or four phases. Thus, the vertical CCD is composed of four pairs of electrodes: namely, 15-a, 15-b; 15-c, 15-d; 15-a', 15-b'; and 15-c, 15-d'. Two systems of optical signals $Q_A$, $Q_B$ and smear $q_S$ are stored under three electrodes paris amongst four, while the remaining pair of electrodes is left vacant. The optical signals $Q_A$, $q_S$ and $Q_B$ are delivered to the horizontal CCDs 3-1, 3-2 and 3-3 by the triple transfer mode which will be explained later. Although two optical signals and one smear are mentioned as three types of signals, the invention is not limited to this configuration, and the kinds of the signals may be selected as desired in accordance with the use. For instance, all the three signals may be optical signals, or a suitable information signal is used in place of the smear.

FIG. 17 is an illustration of the triple transfer operation performed by the vertical CCD 15.

Figure 17A:
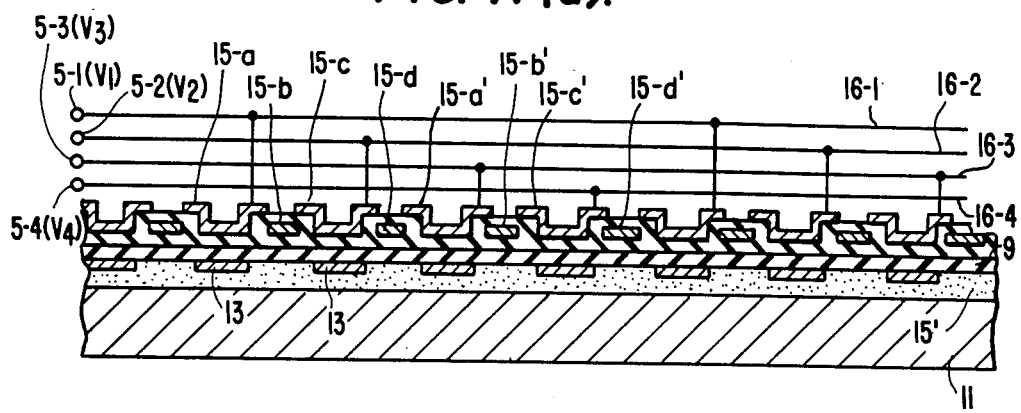

As shown in FIG. 17a, the electrodes 15-a, 15-c, 15-a', 15-c' . . . of respective pairs are connected to respective lines of the clock pulse generator 5-1 to 5-4. At the same time, electric connections are made between the electrodes 15-b and 15-a, between the electrodes 15-d and 15-c, between the electrodes 15-b' and 15-a' and between the electrodes 15-d' and 15-c', as shown in FIG. 7. The potentials under respective electrode pairs at moments $t_1$ to $t_n$ are shown in FIG. 7b. The positions of these electrodes correspond to FIG. 17a.

Figure 17B:
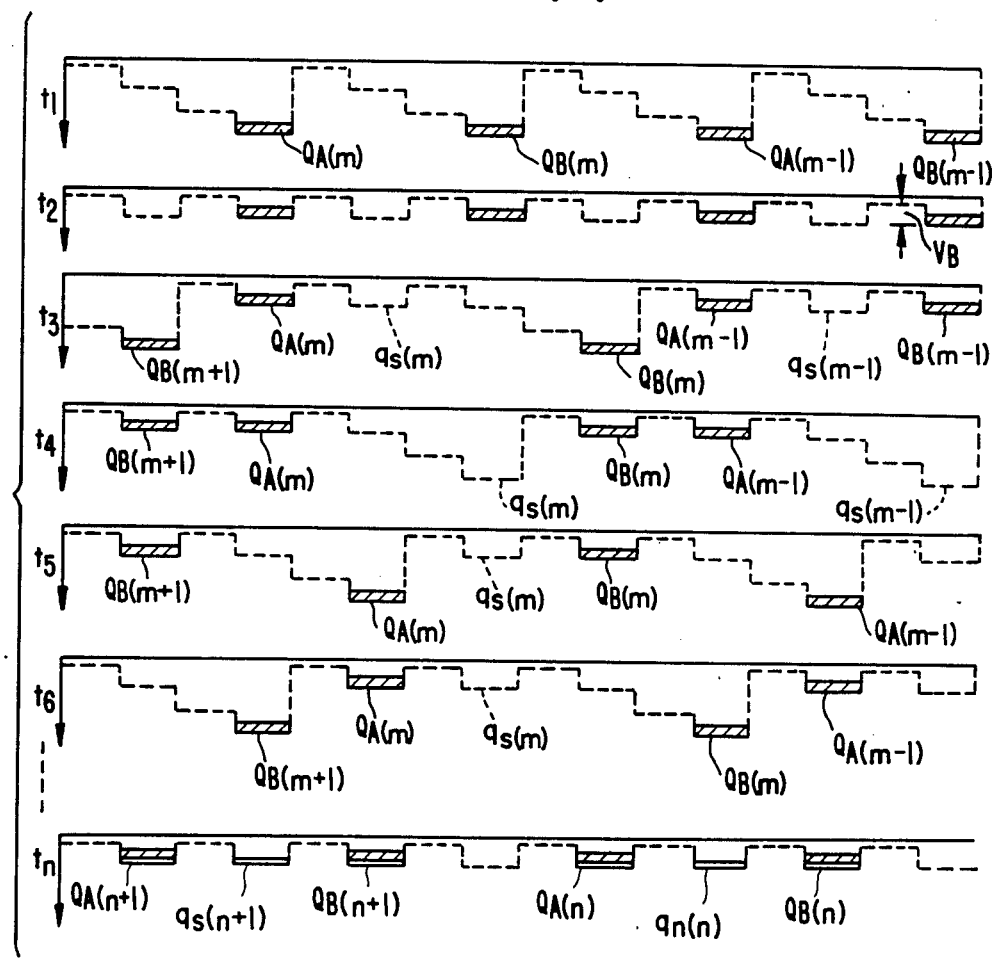

The triple transfer operation will be explained in connection with FIG. 17b.

(i) At a moment $t=t_1$, the signal charges $Q_A$, $Q_B$ accumulated in the photodiodes 1-1, 1-2 by the light applied in the period of 1 frame are delivered to the vertical CCD 15 through the transfer gates 7-1, 7-2 which are in the conductive state, i.e., at reduced potentials, by the application of clock pulses $V_1$, $V_3$ of high voltage ("H" level) thereto, and are stored under the electrodes 15-b, 15-b' of the lowest potential.

(ii) At a moment $t=t_2$, the level of the clock pulses applied to respective electrodes is reduced to low voltage ("L" level), so that the potentials under these electrodes become high. However, the charges $Q_A$ and $Q_B$ are still remain under the same electrodes as those at the moment $t=t_1$, due to the presence of the barrier $V_B$ constituted by the ion injection layer 13 formed under a part of each electrode.

(iii) At a moment $t=t_3$, since this moment is within the scanning period, the charges $Q_A$ and $Q_B$ are transferred to the horizontal CCD. For information, the moments $t_1$ and $t_2$ are within the vertical fly-back period. The charge $Q_B$ which has been stored under the electrode 15-b' is transferred to the region under the electrode 15-d' by the effect of an intermediate voltage ("M" level) applied to the pair of electrodes 15-c', 15-d'.

(iv) At a moment $t=t_4$, the smear charge $q_S$ which is accumulated in the electrode 15-d is transferred to the region under the electrode 15-b' to which the "M" level clock pulse is applied. The smear charge $q_S$ is the charge which is produced by the charge by application of light and leaked to the vertical CCD. Since the leak takes place also in the subsequent transfer period between $t_4$ to $t_m$, the smear charge is increased as the time elapses. Since this charge may leak onto any electrode, the signals $Q_A$ and $Q_B$ inevitably contain the smear components which increase as time elapses.

(v) At a moment $t = t_5$, clock pulses of the "M" level are applied to the pair of electrodes 15-c and 15-d, so that the charge $Q_A$ which has been accumulated under the electrode 15-b is transferred to the region under the electrode 15-d. It is evident that, as a result of operation in the period from the moment $t_3$ to $t_5$, the charges $Q_B$, $q_S$ and $Q_A$ are transferred towards the horizontal CCD by a distance corresponding to one pair of electrodes.

As explained hereinbefore, three pairs of electrodes amongst at least four electrode pairs carry the charges, while the remaining one or more electrode pairs are left vacant. The transfer of signals is made such that the signal A is first transferred from a first electrode pair to a second electrode pair, and the signal B is transferred to the first electrode pair which is now vacant and then the signal C is transferred to the first electrode pair after the signal B has left the first electrode pair for the second electrode pair. This operation is referred to as a triple transfer operation.

(vi) At a moment $t = t_6$, the transfer of the charge $Q_B$ begins again so that the charge $Q_B$ which has been stored in the electrode 15-d' is transferred to the region under the electrode 15-b by the effect of the intermediate voltage of "M" level applied to the pair of electrodes 15-a and 15-b. The triple transfer operation is thus repeated successively such as to transfer three signals $Q_B$, $q_S$ and $Q_B$ to the final electrodes of the vertical CCD. In consequence, the signals $Q_B$, $q_S$ and $Q_A$ are delivered to respective horizontal CCDs 3-1, 3-2 and 3-3, so that the supply of the charges to the horizontal CCDs is completed within the horizontal flyback period. Then, as horizontal scanning begins, the signals $Q_B$, $q_S$ and $Q_A$ are transferred to the outputs 4-1, 4-2, 4-3 through the horizontal CCDs. Since one horizontal CCD 3-1, 3-2 or 3-3 is alloted for each signal, the charges in the horizontal CCD can be transferred in the single transfer mode which is the same as that used in the conventional horizontal CCD.

The state at the moment $t = t_n$ shown in FIG. 17 indicates that the smear charge increases in accordance with the progress of the transfer as the time elapses. The smear charge is shown by a thick black line. In this case, the smear charge quantity in one group, e.g., a group constituted by $Q_{B(n)}$, $q_{S(n)}$ and $Q_{A(n)}$ is almost equal to that in the adjacent group, e.g. a group constituted by $Q_{B(n+1)}$, $q_{S(n+1)}$ and $Q_{A(n+1)}$. That is, the quantities of smear charges leaked into the signals $Q_{A(n)}$ and $Q_{B(n)}$ are almost equal to each other.

A description will be made hereinunder as to the subtraction of the smear charge.

Figure 18:
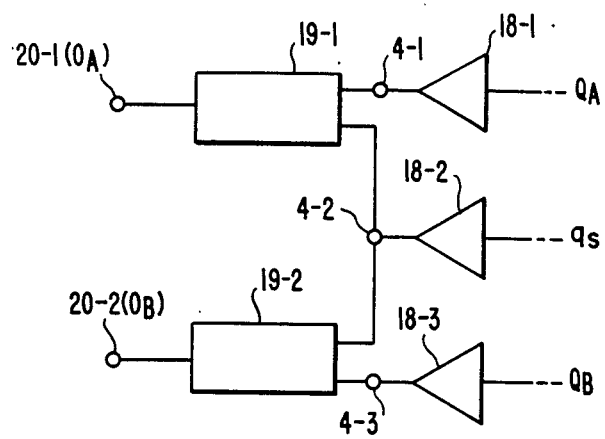
FIG. 18 is an illustration of a smear removing circuit.

FIG. 18 illustrates the basic construction of a smear removing circuit.

In this Figure, numerals 18-1, 18-2 and 18-3 denote charge detection circuits which are provided in the final stages of the horizontal CCDs 3-1, 3-2 and 3-3. Usually, these charge detection circuits are constituted by MOS source follower type circuits. Numerals 4-1, 4-2 and 4-3 denote, respectively, the output terminals of the charge detection circuits, while numerals 19-1 and 19-2 denote subtraction circuits. The subtraction circuits 19-1, 19-2 may be constituted by commercially available differential amplifiers installed externally or may be constituted by MOS differential amplifiers integrated in the device.

Figure 19:
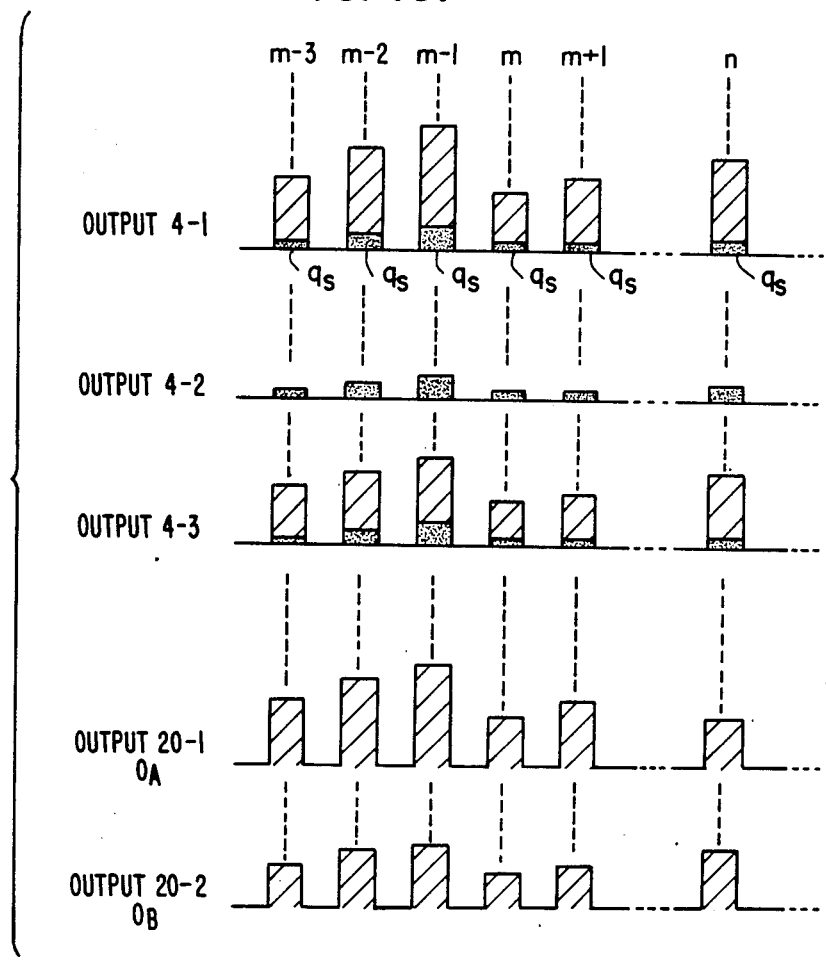
FIG. 19 is an illustration of operation of the smear removing circuit.

FIG. 19 shows the output waveform of the optical signals $Q_A$, $q_S$ and $Q_B$ shown in FIG. 16.

More specifically, FIG. 19 shows the waveforms of signals obtained at the outputs 4-1, 4-2, 4-3 detected by the charge detection circuits 18-1, 18-2, 18-3, as well as the waveforms of the outputs 20-1, 20-1 of the subtraction devices 19-1, 19-2.

As stated before, the signals of the same group indicated by m or n involve the same quantity of smear signal component (the smear signal component $q_S$ is shown by thick black lines), so that a true optical signal $O_A$ devoid of smear component is obtained at the output 20-1 as the outputs 4-1, 4-2 are input to the subtraction device 19-1. Similarly, a true optical signal $O_B$ devoid of smear component is obtained at the output 20-2 as the outputs 4-3 and 4-4 are input to the subtraction device 19-2.

Figure 20:
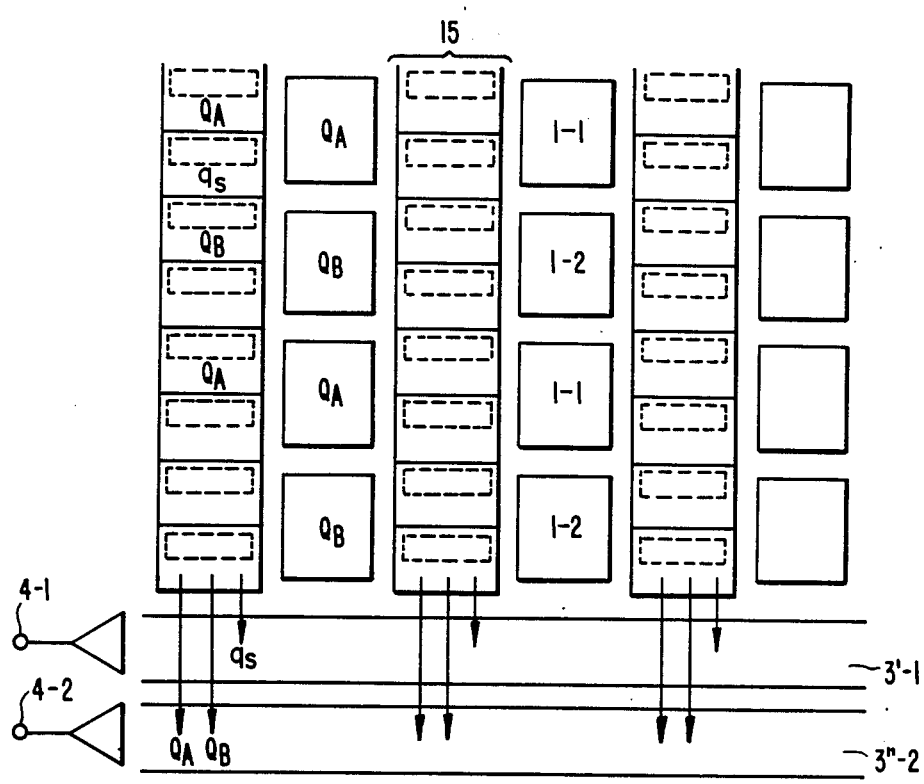

FIG. 20 shows the construction of another embodiment of CCD imaging device of the invention.

In the embodiment shown in FIG. 16, three types of signal charges $Q_A$, $q_S$ and $Q_B$ are transferred through three horizontal CCDs 3-1, 3-2 and 3-3. In the embodiment shown in FIG. 20, these three types of signal charges $Q_A$, $q_S$ and $Q_B$ are transferred through two horizontal CCDs 3'-1 and 3'-2. This can be realized by arranging it such that one of the horizontal CCDs transfers two types of signals, e.g., $Q_A$ and $Q_B$, while the other CCD transfers one signal, e.g., $q_S$.

To this end, the horizontal CCD 3'-2 for transferring two types of signal performs a double transfer operation, while the horizontal CCD 3'-1 for transferring one type of signal performs a single transfer operation. To realize the double transfer operation, charges are carried by two pairs of electrodes among more than three pairs of electrodes connected to the lines from the clock pulse generator, while at least one remaining electrode pair is left vacant, and the operation is made such that the signal A is first transferred to the vacant electrode pair and, after the signal A has left this electrode pair, the next signal B is transferred to this electrode pair.

Figure 21:
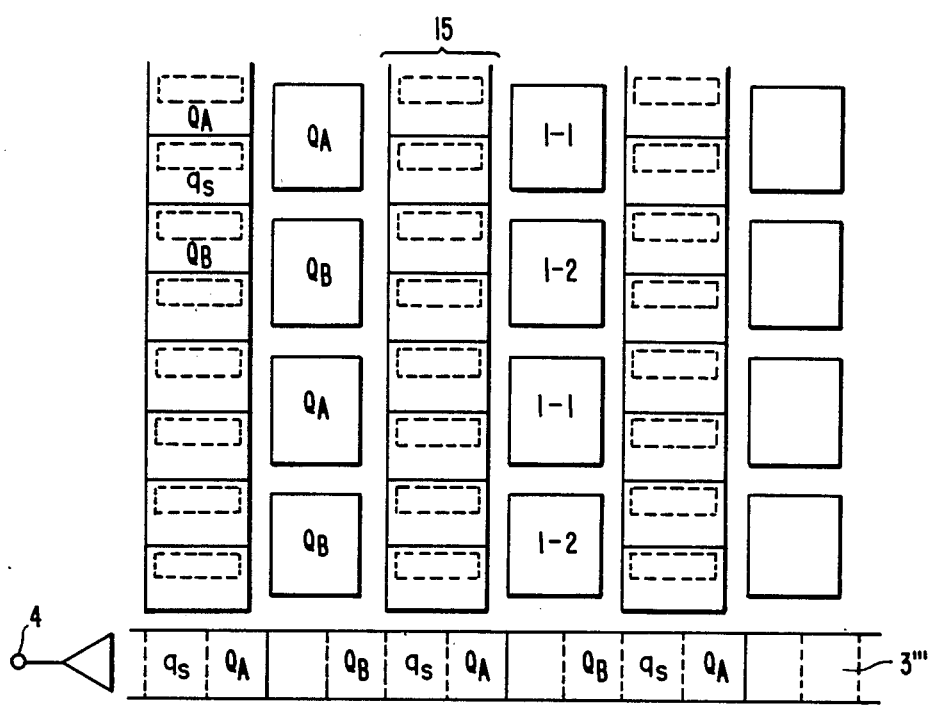
Figure 22:
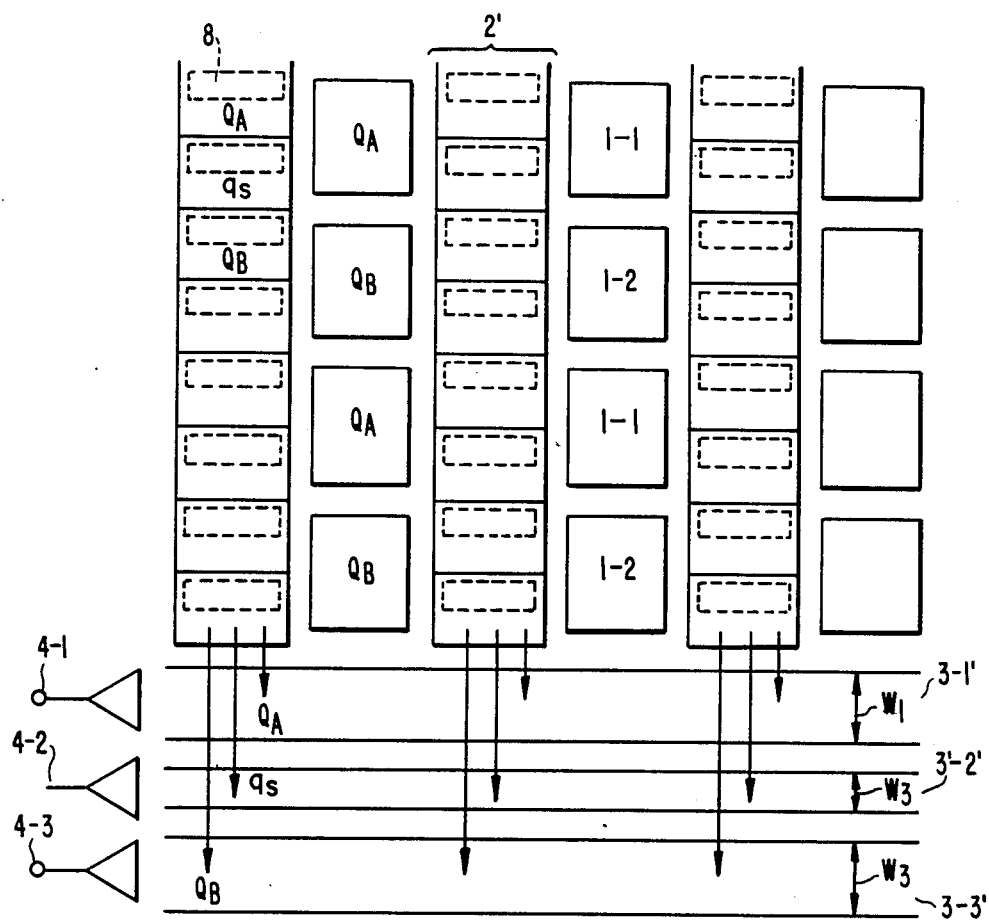

FIGS. 21 and 22 show different embodiments of the CCD imaging device of the invention. More specifically, the embodiment shown in FIG. 21 is arranged such that three types of signals $Q_A$, $q_S$ and $Q_B$ are transferred through a single row of horizontal CCD 3'''. In this case, it is necessary that the horizontal CCD 3''' be designed such as to be able to perform triple transfer operation as in the case of the vertical CCD 15.

When a plurality of horizontal CCDs are arranged as in the case of the embodiment shown in FIGS. 16 and 20, it is not necessary that the horizontal CCDs have an identical width. Namely, the quantity of the smear charge is usually 1/10 or less the quantity of the optical signal charge, so that the horizontal CCD 3-2' for transferring the smear charge can have a channel width W2 which is smaller than the channel widths W1, W3 of other horizontal CCDs 3-1', 3-3' for transferring optical signals. The following three cases are conceivable in regard to the size of the channel widths of the horizontal CCDs.

$W_2 < W_1 = W_3$ (Channel widths for $Q_A$ and $Q_B$ are equal)

$W_2 < W_1 < W_3$ (Channel width for $Q_A$ smaller than that for $Q_B$)

$W_2 < W_3 < W_1$ (Channel width for $Q_A$ larger than that for $Q_B$)

In the embodiment shown in FIG. 16, the horizontal CCD 3-2 for transferring the smear charge is disposed between the horizontal CCDs 3-1 and 3-3 for transferring the signal charges $Q_A$ and $Q_B$. The invention is not however, limited to this configuration, and the positions of the horizontal CCDs can be modified as desired by changing the sequence of the signal transfer such as ($q_S$, $Q_B$, $Q_A$) or ($Q_A$, $Q_B$, $q_S$) besides the described sequence of ($Q_B$, $q_S$, $Q_A$).

Thus, the arrangement may be such that the horizontal CCD 3-1 is used for the transfer of the smear charge, while horizontal CCDs 3-2, 3-3 are used for the transfer of the signal charges, or that the horizontal CCDs 3-1, 3-2 are used for the transfer of the signal charges while the horizontal CCD 3-3 is used for the transfer of the smear charge.

In the embodiments explained in connection with FIGS. 16, 20, 21 and 22, the vertical CCD 15 is designed to transfer three types of signals $Q_A$, $Q_B$ and $q_S$. The invention is not however, limited to this configuration, and the arrangement may be such that only the optical signal charges $Q_A$ and $Q_B$ are finally used, while the smear charge $q_S$ is eliminated by an absorber drain provided in the final stage of the vertical CCD. It is of course possible to also eliminate the smear charge in the horizontal CCD by providing an absorber drain in the final stage of such horizontal CCD. Although the embodiments described hereinbefore are designed such that three types of signals are tranferred through the vertical CCD, the invention is not limited to this arrangement, and the arrangement may be such that the vertical CCD transmits less than three signals, e.g., the signals $Q_A$ and $Q_B$, or one signal in combination with information other than the related to smear. In such a case, the subtraction devices explained in connection with FIG. 18 may be omitted, but the smear charge involved in the optical signals cannot be removed because of the elimination of subtraction.

The arrangement may also be such that the optical signals are read from the optical diodes of one line, i.e., an odd-numbered line in the first frame and an even-numbered line in the second frame, as in the case of the known device shown in FIG. 1. In such a case, the device can be composed of either one or two horizontal CCDs, because only one signal $Q_A$ or $Q_B$ is transferred together with the smear signal $q_S$. However, the field after image due to interlace remains undesirably as in the case of the conventional device, although the smear charge components in the optical signal $Q_A$ or $Q_B$ can be removed.

The transfer of two kinds of signals may be conducted in the aforementioned triple transfer operation using 4-phase clocks or, alternatively, by a double transfer operation using 4-phase clocks.

From another point of view, the double transfer operation using 4-phase clocks can be regarded as being a single transfer operation using 2-phase clocks.

As will be understood from the foregoing description, the invention enables the transfer of three types of signals, i.e., two optical signals and one smear signal, while maintaining the same opening ratio (35 to 40%) as the conventional device, by virtue of the triple transfer operation performed by the vertical CCD. In addition, two types of true optical signals, i.e., signals for an odd-numbered line and signals for an even-numbered line, devoid of the smear signals can be obtained by subtrating the smear signals from the two types of optical signals.

The result of an experiment conducted by the present inventors proved that 50% interlace after image, which is inevitably produced in the conventional device, can be eliminated almost completely, and about 40 dB reduction of smear is attainable as compared with the conventional device.

Although the invention has been described with reference to an interline type CCD device as a typical example of the conventional solid-state imaging device, the invention is not limited to this type of device but is applicable equally well to other types of CCD type of devices such as frame-transfer type of CCD device.

What is claimed is:

1. A charge transfer type solid-state imaging device comprising:
   a plurality of photoelectric conversion elements arranged in line and row directions on the surface of a semiconductor substrate, said photoelectric conversion elements being adapted to store signal charges corresponding to the quantities of incidence light;
   first charge transfer means arranged alongside respective rows of said photoelectric conversion elements and for successively picking up and transferring signal charges stored in said photoelectric conversion elements, each of said first charge transfer means having a plurality of electrode pairs which form regions of different potentials in said semiconductor substrate;
   means for supplying pulse signals in a predetermined sequence to said electrodes of said first charge transfer means, thereby causing said signal charges to be transferred; and
   second charge transfer means for receiving in a parallel manner the plurality of rows of signal charges transferred by said first charge transfer means and for transferring the thus received signal charges in sequence to the output terminal;
   wherein each of said first charge transfer means includes at least two pairs of electrodes arranged within the pitch of said photoelectric conversion elements in the row direction, each of said first charge transfer means has an impurity region provided under one of the electrodes of each pair, such as to form a potential differential, and said electrodes of each pair are electrically connected to each other.

2. A charge transfer type solid-state imaging device according to claim 1, wherein said electrodes of each pair are electrically connected to each other through an Al conductor.

3. A charge transfer type solid-state imaging device according to claim 1, wherein said electrodes of each pair are electrically connected to each other by one of said electrodes of each pair.

4. A charge transfer type solid-state imaging device according to claim 1, wherein wiring for delivering the pulse signals from said pulse supplying means to respective electrode pairs of said first charge transfer means is laid parallel to the lines between adjacent lines of said photoelectric electric conversion elements and is connected to one of the electrodes of the electrode pair.

5. A charge transfer type solid-state imaging device according to claim 1, wherein wiring for delivering the pulse signals from said pulse supplying means to respective electrode pairs of said first charge transfer means is laid on said first charge transfer means parallel to the rows.

6. A charge transfer type solid-state imaging device according to claim 1, wherein first wiring for delivering the pulse signals from the pulse supplying means to respective electrode pairs of said first charge transfer means is laid parallel to the rows on predetermined first charge transfer means and connected to predetermined electrode pairs, and the supply of the pulse signals to the first charge transfer means on which no wiring is provided is conducted through second wiring which leads from said first wiring in the direction of lines of said photoelectric conversion elements.

7. A charge transfer type of solid-state imaging device according to claim 1, wherein said first charge transfer means can transfer the signal charges stored in all photoelectric conversion elements.

8. A charge transfer type solid-state imaging device according to claim 7, wherein said first charge transfer means is also capable of transferring the smear charge.

9. A charge transfer type solid-state imaging device according to claim 8, further comprising a means provided in the output terminal for removing the smear charge from the signal charges.

10. A charge transfer type solid-state imaging device according to claim 9, comprising two or more of said second transfer means.

11. A charge transfer type solid-state imaging device according to claim 10, wherein said two or more second charge transfer means have different channel widths.

12. A charge transfer type solid-state imaging device according to claim 8, wherein said first charge transfer means include a plurality of groups of electrode pairs constituted by first, second, third and fourth electrode pairs, the first, second and third electrode pairs carrying, respectively, the signal charge from an odd-number line, signal charge from an even-number line and a smear charge, while said fourth electrode pair is left vacant, wherein the charges are transferred sequentially and cyclically such that the charge in said third electrode pair is transferred to the vacant fourth electrode pair and the charge in the second electrode pair is transferred to the third electrode pair which is now vacant, followed by the transfer of the charge in said first electrode pair to the second electrode pair which is now vacant.

13. A charge transfer type solid-state imaging device according to claim 8, wherein said second charge transfer means include a plurality of groups of electrode pairs constituted by first, second, third and fourth electrode pairs, the first, second and third electrode pairs carrying, respectively, the signal charge from an odd-number line, signal charge from an even-number line and a smear charge, while said fourth electrode pair is left vacant, wherein the charges are transferred sequentially and cyclically such that the charge in said third electrode pair is transferred to the vacant fourth electrode pair and the charge in the second electrode pair is transferred to the third electrode pair which is now vacant, followed by the transfer of the charge in said first electrode pair to the second electrode pair which is now vacant.

14. A charge transfer type solid-state imaging device comprising:
a plurality of photoelectric conversion elements arranged in line and row directions on the surface of a semiconductor substrate, said photoelectric conversion elements being adapted to store signal charges corresponding to the quantities of incidence light;

first charge transfer means arranged alongside respective rows of said photoelectric conversion elements and for successively picking up and transferring signal charges stored in said photoelectric conversion elements, each of said first charge transfer means having a plurality of electrode pairs which form regions of different potentials in said semiconductor substrate;

means for supplying pulse signals in a predetermined sequence to said electrodes of said first charge transfer means, thereby causing said signal charges to be transferred; and second charge transfer means for receiving in a parallel manner the plurality of rows of signal charges transferred by said first charge transfer means and for transferring the thus received signal charges in sequence to the output terminal;

wherein each of said first charge transfer means includes at least two pairs of electrodes arranged within the pitch of said photoelectric conversion elements in the row direction, wherein wiring for delivering the pulse signals from said pulse supplying means to respective electrode pairs of said first charge transfer means is laid on said first charge transfer means parallel to the rows.

15. A charge transfer type solid-state imaging device comprising:
a plurality of photoelectric conversion elements arranged in line and row directions on the surface of a semiconductor substrate, said photoelectric conversion elements being adapted to store signal charges corresponding to the quantities of incidence light;

first charge transfer means arranged alongside respective rows of said photoelectric conversion elements and for successively picking up and transferring signal charges stored in said photoelectric conversion elements, each of said first charge transfer means having a plurality of electrode pairs which form regions of different potentials in said semiconductor substrate;

means for supplying pulse signals in a predetermined sequence to said electrodes of said first charge transfer means, thereby causing said signal charges to be transferred; and second charge transfer means for receiving in a parallel manner the plurality of rows of signal charges transferred by said first charge transfer means and for transferring the thus received signal charges in sequence to the output terminal;

wherein each of said first charge transfer means includes at least two pairs of electrodes arranged within the pitch of said photoelectric conversion elements in the row direction, wherein wiring for delivering the pulse signals from said pulse supplying means to respective electrode pairs is laid on said first charge transfer means also parallel to the rows and parallel to the lines between adjacent lines of said photoelectric conversion elements.

* * * * *